(12) United States Patent
Li (10) Patent No.: US 10,339,869 B1
(45) Date of Patent: Jul. 2, 2019

(54) OLED DISPLAY DEVICE (71) Applicant: Wuhan China Star Optoelectronics Semiconductor Display Technology Co., Ltd., Wuhan, Hubei (CN)

(72) Inventor: Shuang Li, Hubei (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 15/760,722

(22) PCT Filed: Feb. 26, 2018

(86) PCT No.: PCT/CN2018/077262
§ 371 (c)(1),
(2) Date: Mar. 16, 2018

(30) Foreign Application Priority Data

Feb. 1, 2018 (CN) .......................... 2018 1 0102627

(51) Int. Cl.
G09G 3/30 (2006.01)
G09G 3/3258 (2016.01)
H01L 27/12 (2006.01)
G09G 3/3233 (2016.01)
H01L 51/52 (2006.01)

(52) U.S. Cl.
CPC ......... *G09G 3/3258* (2013.01); *G09G 3/3233* (2013.01); *H01L 27/1214* (2013.01); *H01L 51/5206* (2013.01); *H01L 51/5221* (2013.01)

(58) Field of Classification Search
CPC ................ G09G 3/3258; G09G 3/3233; H01L 51/5206; H01L 51/5221; H01L 27/1214
See application file for complete search history.

(56) References Cited

U.S. PATENT DOCUMENTS

| 2015/0116295 A1* | 4/2015 | Pyon | .................... H01L 27/3276 345/211 |
| 2016/0141352 A1* | 5/2016 | Sung | .................... G09G 3/3233 257/40 |
| 2016/0204181 A1* | 7/2016 | So | ........................ H01L 27/3276 257/40 |

FOREIGN PATENT DOCUMENTS

| CN | 1652649 A | 8/2005 |
| CN | 101436382 A | 5/2009 |
| CN | 101926020 A | 12/2010 |
| CN | 106711182 A | 5/2017 |
| JP | 2011-118341 A | 6/2011 |
| JP | 2014-29424 A | 2/2014 |

* cited by examiner

*Primary Examiner* — Nelson M Rosario
*Assistant Examiner* — Andrew Lee
(74) *Attorney, Agent, or Firm* — Leong C. Lei (57) ABSTRACT

The invention provides an OLED display device, comprising an OLED display panel and a first driving circuit connected to the OLED display panel. A DC signal line is disposed in an active area of the OLED display panel. A non-active area is disposed with a first DC signal output end and a second DC signal output end, located at two opposite ends of the OLED display panel. One of the two adjacent DC signal lines receiving a signal from the first DC signal output end, and the other from the second DC signal output end so that the impedance changes in the two adjacent DC signal lines are reversed in the signal transmission process. The display unevenness of two adjacent sub-pixels can compensate each other to reduce the impact of voltage drop of DC signal line on the display evenness of the OLED display device to improve display quality.

16 Claims, 4 Drawing Sheets

OLED DISPLAY DEVICE

RELATED APPLICATIONS

The present application is a National Phase of International Application Number PCT/CN2018/077262, filed Feb. 26, 2018, and claims the priority of China Application No. 201810102627.6, filed Feb. 1, 2018.

BACKGROUND OF THE INVENTION

1. Field of the Invention

The present invention relates to the field of display techniques, and in particular to a light-emitting diode (OLED) display device.

2. The Related Arts

The organic light-emitting diode (OLED) device provides the advantages of self-luminous, low driving voltage, high luminous efficiency, short response time, sharpness and contrast, nearly 180° viewing angle, wide temperature range, flexibility, ability to achieve flexible display and large-area full-color display, and many other advantages, and is recognized by the industry as the most promising display device.

The OLED display device generally comprises a substrate, an anode disposed on the substrate, a hole injection layer (HIL) disposed on the anode, a hole transport layer (HTL) disposed on the hole injection layer, a light-emitting layer disposed on the hole transport layer, an electron transport layer (ETL) on the light-emitting layer, an electron injection layer (EIL) disposed on the electron transport layer, and a cathode disposed on the electron injection layer. The light-emitting principle of OLED display devices is as follows: the semiconductor material and organic light-emitting material are driven by the electric field driven to cause light emission through carrier injection and recombination. Specifically, the OLED display device usually adopts an indium tin oxide (ITO) pixel electrode and a metal electrode as an anode and a cathode, respectively. Under a certain voltage, electrons and holes are injected from the cathode and the anode into the electron transport layer and the hole transport layers respectively, the electrons and holes respectively migrate through the electron transport layer and the hole transport layer to the light-emitting layer and meet in the light-emitting layer to form excitons and excite the light-emitting molecules that emit visible light through radiation relaxation.

Figure 1:
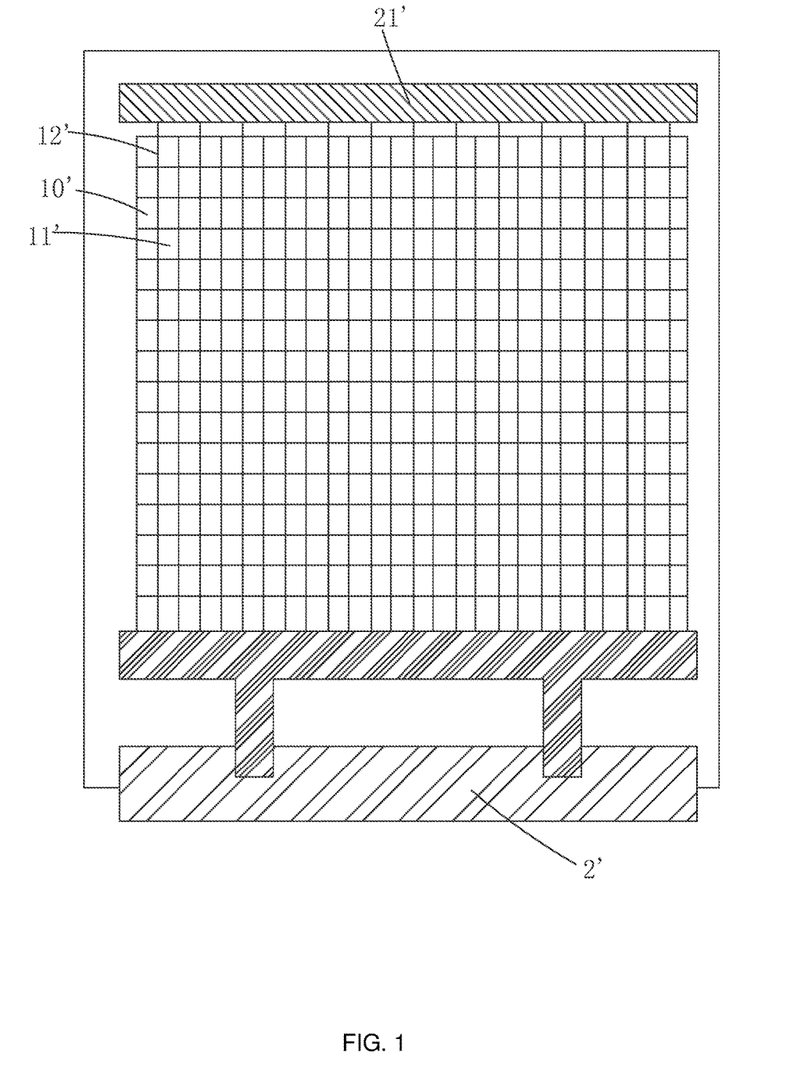
FIG. 1 is a schematic view showing a structure of a known OLED display device.

For the OLED display device, a pixel driving circuit is disposed in the sub-pixels, and a driving thin film transistor (TFT) for driving the OLED is provided in the pixel driving circuit. During the use, due to the aging of the OLED and the threshold voltage drift of the driving TFT, the display quality of the OLED display device is degraded. Therefore, the threshold voltage of the driving TFT needs to be compensated during the use of the OLED display device. In order to compensate the threshold voltage of the driving TFT, in addition to providing the general data signal Data, other direct current (DC) signals, such as, initialization voltage (Vini), are needed. As shown in FIG. 1, for providing the initialization voltage Vini to each sub-pixel, the known technology needs to dispose a plurality of parallel interval-spaced vertical DC signal lines 12' in the active area 10' of the OLED display panel, with each DC signal line 12' electrically connected to a column of sub-pixels 11' correspondingly, each DC signal line 12' having one end electrically connected to the driving circuit board 2' to obtain the initialization voltage and the other end electrically connected to a short-circuited end 21'. At this point, because of the impact of the impedance of the DC signal line 12', the sub-pixel 11' farther away from the driving circuit board 2' will receive an initialization voltage smaller than the sub-pixel 11' closer to the driving circuit board 2', leading to uneven display.

SUMMARY OF THE INVENTION

The object of the present invention is to provide an OLED display device, able to reduce the impact of the voltage drop (IR drop) of the DC signal line on the display evenness of the OLED display device and improve the display quality of the OLED display device.

To achieve the above object, the present invention provides an OLED display device, which comprises: an OLED display panel, and a first driving circuit electrically connected to the OLED display panel;

the OLED display panel comprising: an active area and a non-active area surrounding the active area;

the active area comprising: a plurality of sub-pixels arranged in an array, and a plurality of direct current (DC) signal lines arranged in parallel and arranged in a column direction extending along the sub-pixels, with each of the sub-pixels being electrically connected to a DC line; the non-active area comprising: a first DC signal output end, a second DC signal output end, a first short-circuited end, and a second short-circuited end; the first DC signal output end, the second short-circuited end and the first driving circuit being disposed and spaced apart at a first end of the OLED display panel; the second DC signal output end and the first short-circuited end being disposed and spaced apart at a second end of the OLED display panel, the first end of the OLED display panel and the second end of the OLED display panel being opposite ends of the OLED display panel along the column direction of arrangement of the sub-pixels;

the first DC signal output end and the second DC signal output end both being electrically connected to the first driving circuit; in two adjacent DC signal lines, both ends of one DC signal line being electrically connected respectively to the first DC signal output end and the first short-circuited end, and both ends of the other DC signal line being electrically connected respectively to the second DC signal output end and the second short-circuited end.

According to a preferred embodiment of the present invention, the active area further comprises a plurality of data lines arranged in parallel, spaced apart and electrically connected to the first driving circuit, a plurality of first scan lines arranged in parallel and spaced apart, a plurality of second scan lines arranged in parallel and spaced apart, and a plurality of emitting (EM) signal lines arranged in parallel and spaced apart, with the data lines parallel to the DC signal lines, the first scan line, the second scan line, and the emitting signal line all perpendicular to the DC signal lines, and each row of sub-pixels electrically connected to a first scan line, a second scan line and an emitting signal line correspondingly, and each row of sub-pixels being electrically connected to a data line.

According to a preferred embodiment of the present invention, each sub-pixel is disposed with a pixel driving circuit, and the pixel driving circuit comprises: a first thin film transistor (TFT), a second TFT, a third TFT, a fourth TFT, a first capacitor, a second capacitor, and an OLED;

the first TFT having a gate electrically connected to the first scan line corresponding to the sub-pixel, a source electrically connected to the data line corresponding to the sub-pixel, and a drain electrically connected to a gate of the fourth TFT;

the second TFT having a gate connected to the second scan line corresponding to the sub-pixel, a source electrically connected to a source of the fourth TFT, and a drain electrically connected to the DC signal line corresponding to the sub-pixel;

the third TFT having a gate electrically connected to the Emitting signal line corresponding to the sub-pixel, a source electrically connected to a high voltage source, and a drain electrically connected to the drain of the fourth TFT;

the first capacitor having a first end electrically connected to the gate of the fourth TFT, and a second end electrically connected to the source of the fourth TFT;

the second capacitor having a second end electrically connected to the source of the third TFT, and a drain electrically connected to the source of the fourth TFT;

the OLED having an anode electrically connected to the source of the fourth TFT, and a cathode electrically connected to a low voltage source.

According to a preferred embodiment of the present invention, the first DC signal output end and the second DC signal output end are for receiving an initialization voltage from the first driving circuit and providing the initialization voltage to the DC signal line;

the first scan line, the second scan line, and the emitting signal line are for providing a first scan signal, a second scan signal, and an EM signal to the corresponding sub-pixels respectively.

According to a preferred embodiment of the present invention, the first scan signal, the second scan signal, the EM signal, and the data signal are combined to correspond to an initialization phase, a sampling phase, a programming phase, and an emitting phase;

in the initialization phase, the first scan signal is at a first voltage level, the second scan signal is at the first voltage level, the EM signal is at a second voltage level, and the data signal is at a reference voltage level;

in the sampling phase, the first scan signal is at the first voltage level, the second scan signal is at the second voltage level, the EM signal is at the first voltage level, and the data signal is at the reference voltage level;

in the programming phase, the first scan signal is at the first voltage level, the second scan signal is at the second voltage level, the EM signal is at the second level, and the data signal is at a data voltage level;

in the emitting phase, the first scan signal is at the second voltage level, the second scan signal is at the second voltage level, the EM signal is at the first voltage level, and the data signal is at the reference voltage level; the first voltage level and the second voltage level are opposite voltage levels.

According to a preferred embodiment of the present invention, the first TFT, the second TFT, the third TFT, and the fourth TFT are P-type TFTs, the first voltage level is a low voltage level, and the second voltage level is a high voltage level.

According to a preferred embodiment of the present invention, the first TFT, the second TFT, the third TFT, and the fourth TFT are N-type TFTs, the first voltage level is a high voltage level, and the second voltage level is a low voltage level.

According to a preferred embodiment of the present invention, the non-active area further comprises: a connection wire, and the second DC signal output end is electrically connected to the first driving circuit through the connection wire.

According to a preferred embodiment of the present invention, the first short-circuited end is located between the second DC signal output end and the active area, the second short-circuited end is located between the first DC signal output end and the active area.

According to a preferred embodiment of the present invention, the OLED display device further comprises a second driving circuit, and the first scan line, the second scan line, and the Emitting signal line are electrically connected to the second driving circuit to receive the first scan signal, the second scan signal, and the EM signal from the second driving circuit.

The present invention also provides an OLED display device, which comprises: an OLED display panel, and a first driving circuit electrically connected to the OLED display panel;

the OLED display panel comprising: an active area and a non-active area surrounding the active area;

the active area comprising: a plurality of sub-pixels arranged in an array, and a plurality of direct current (DC) signal lines arranged in parallel and arranged in a column direction extending along the sub-pixels, with each of the sub-pixels being electrically connected to a DC line; the non-active area comprising: a first DC signal output end, a second DC signal output end, a first short-circuited end, and a second short-circuited end; the first DC signal output end, the second short-circuited end and the first driving circuit being disposed and spaced apart at a first end of the OLED display panel; the second DC signal output end and the first short-circuited end being disposed and spaced apart at a second end of the OLED display panel, the first end of the OLED display panel and the second end of the OLED display panel being opposite ends of the OLED display panel along the column direction of the sub-pixel arrangement;

the first DC signal output end and the second DC signal output end both being electrically connected to the first driving circuit; in two adjacent DC signal lines, both ends of one DC signal line being electrically connected respectively to the first DC signal output end and the first short-circuited end, and both ends of the other DC signal line being electrically connected respectively to the second DC signal output end and the second short-circuited end;

wherein the active area further comprising a plurality of data lines arranged in parallel, spaced apart and electrically connected to the first driving circuit, a plurality of first scan lines arranged in parallel and spaced apart, a plurality of second scan lines arranged in parallel and spaced apart, and a plurality of emitting (EM) signal lines arranged in parallel and spaced apart, with the data lines parallel to the DC signal lines, the first scan line, the second scan line, and the emitting signal line all perpendicular to the DC signal lines, and each row of sub-pixels electrically connected to a first scan line, a second scan line and an emitting signal line correspondingly, and each row of sub-pixels being electrically connected to a data line;

wherein each sub-pixel is disposed with a pixel driving circuit, and the pixel driving circuit comprising: a first thin film transistor (TFT), a second TFT, a third TFT, a fourth TFT, a first capacitor, a second capacitor, and an OLED;

the first TFT having a gate electrically connected to the first scan line corresponding to the sub-pixel, a source electrically connected to the data line corresponding to the sub-pixel, and a drain electrically connected to a gate of the fourth TFT;

the second TFT having a gate connected to the second scan line corresponding to the sub-pixel, a source electrically connected to a source of the fourth TFT, and a drain electrically connected to the DC signal line corresponding to the sub-pixel;

the third TFT having a gate electrically connected to the Emitting signal line corresponding to the sub-pixel, a source electrically connected to a high voltage source, and a drain electrically connected to the drain of the fourth TFT;

the first capacitor having a first end electrically connected to the gate of the fourth TFT, and a second end electrically connected to the source of the fourth TFT;

the second capacitor having a second end electrically connected to the source of the third TFT, and a drain electrically connected to the source of the fourth TFT;

the OLED having an anode electrically connected to the source of the fourth TFT, and a cathode electrically connected to a low voltage source;

wherein the non-active area further comprising: a connection wire, and the second DC signal output end being electrically connected to the first driving circuit through the connection wire;

wherein the first short-circuited end being located between the second DC signal output end and the active area, the second short-circuited end being located between the first DC signal output end and the active area.

The present invention provides the following advantages. The present invention provides an OLED display device, comprising an OLED display panel and a first driving circuit electrically connected to the OLED display panel. A DC signal line is disposed in an active area of the OLED display panel. The non-active area is disposed with a first DC signal output end and a second DC signal output end, located at two opposite ends of the OLED display panel. One of the two adjacent DC signal lines receiving a signal from the first DC signal output end, and the other from the second DC signal output end so that the impedance changes in the two adjacent DC signal lines are reversed in the signal transmission process; therefore the display unevenness of the two adjacent sub-pixels can compensate each other to reduce the impact of voltage drop of DC signal line on the display evenness of the OLED display device to improve the display quality of the OLED device.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technique means and effect of the present invention, the following uses preferred embodiments and drawings for detailed description.

Figure 2:
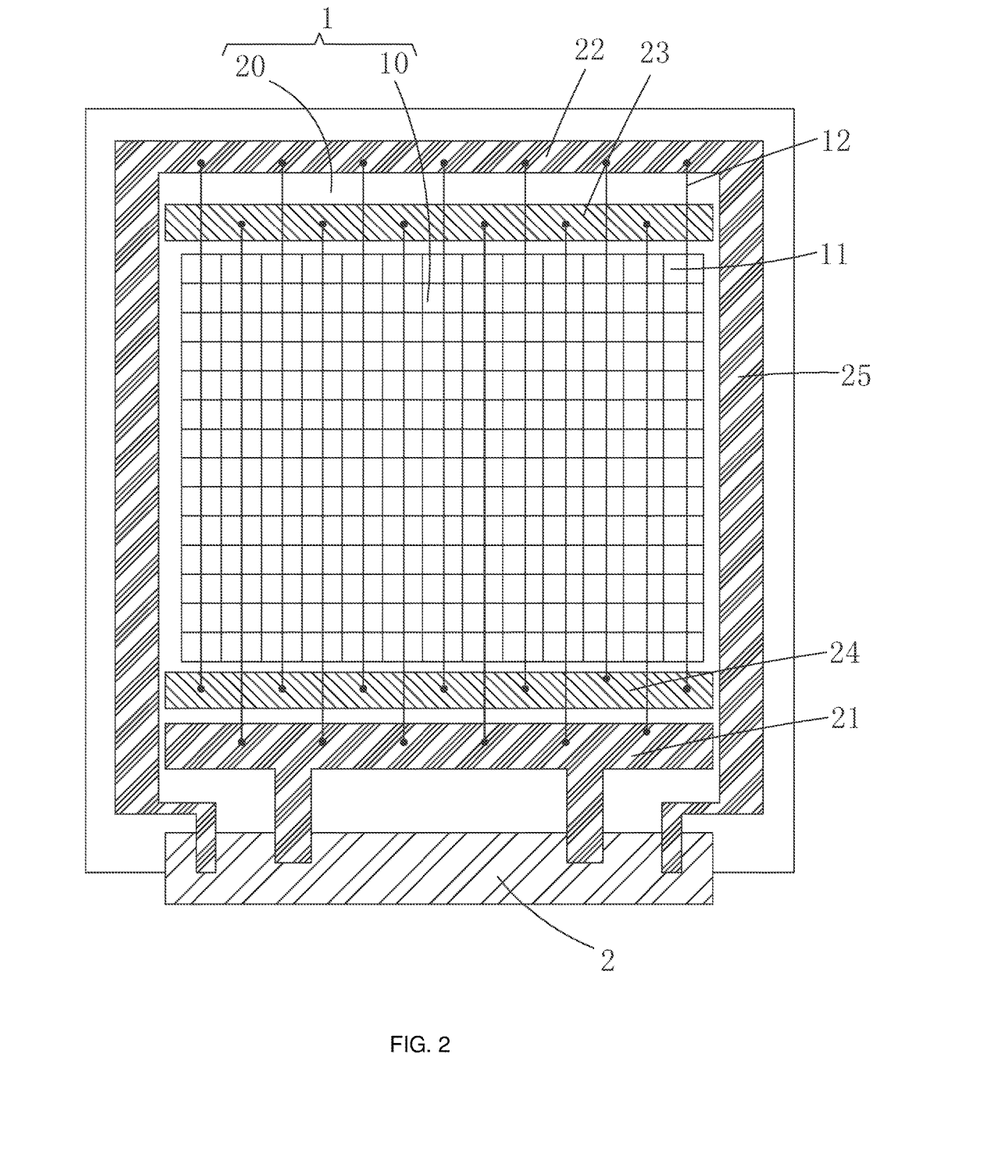
FIG. 2 is a schematic view showing an OLED display device provided by the embodiment of the present invention.

Referring to FIG. 2, the present invention provides an OLED display device, which comprises: an OLED display panel 1, and a first driving circuit 2 electrically connected to the OLED display panel 1;

the OLED display panel 1 comprising: an active area 10 and a non-active area 20 surrounding the active area 10;

the active area 10 comprising: a plurality of sub-pixels 11 arranged in an array, and a plurality of direct current (DC) signal lines 12 arranged in parallel and arranged in a column direction extending along the sub-pixels 11, with each of the sub-pixels 11 being electrically connected to a DC line 12;

the non-active area 20 comprising: a first DC signal output end 21, a second DC signal output end 22, a first short-circuited end 23, and a second short-circuited end 24; the first DC signal output end 21, the second short-circuited end 24 and the first driving circuit 2 being disposed and spaced apart at a first end of the OLED display panel 1; the second DC signal output end 22 and the first short-circuited end 23 being disposed and spaced apart at a second end of the OLED display panel 1, the first end of the OLED display panel 1 and the second end of the OLED display panel 1 being opposite ends of the OLED display panel 1 along the column direction of the sub-pixel 11 arrangement;

the first DC signal output end 21 and the second DC signal output end 22 both being electrically connected to the first driving circuit 2; wherein in two adjacent DC signal lines 12, both ends of one DC signal line 12 being electrically connected respectively to the first DC signal output end 21 and the first short-circuited end 23, and both ends of the other DC signal line 12 being electrically connected respectively to the second DC signal output end 22 and the second short-circuited end 24.

Specifically, as shown in FIG. 2, the first DC signal output end 21, the second DC signal output end 22, the first short-circuited end 23, and the second short-circuited end 24 are all conductive wires extended along the row direction of the arrangement of the sub-pixels 11. Also, to achieve the electrical connection between the second DC signal output end 22 and the first driving circuit 2, the non-active area 20 further comprises: a connection wire 25, and one end of the second DC signal output end 22 is electrically connected to the first driving circuit 2 through the connection wire 25. During manufacturing, the connection wire 25 and the second DC signal output end 22 are fabricated monolithically.

It should be noted that although the first driving circuit 2 and the second DC signal output end 22 are electrically connected through the connection wire 25, the connection wire 25 has a very small impedance compared to the DC signal line 12 in the active area 10 as the connection wire 25 is manufactured inside the non-active area 20 of the OLED display device; therefore, although the signal must pass the connection wire when the first driving circuit 2 outputs the signal from the second DC signal output end 22, the voltage drop of the signal is very small. Hence, the signal received from the second DC output end 22 and the signal received from the first DC signal output end 21 are consistent.

Specifically, in the resent invention, the DC signal line 12 connected to the first DC signal output end 21 is further connected to the first short-circuited end 23, and the DC signal line 12 connected to the second DC signal output end 22 is further connected to the first short-circuited end 24, so that the signals received from the DC signal line 12 connected to the first DC signal output 21 are consistent, and the signals received from the DC signal line 12 connected to the second DC signal output 22 are also consistent. When the first DC signal output end 21 and the second DC signal output end 22 receive the same signal, all the signals received on the DC signal lines 12 are consistent.

Preferably, as shown in FIG. 2, the first short-circuited end 23 is located between the second DC signal output end 22 and the active area 10, the second short-circuited end 24 is located between the first DC signal output end 21 and the active area 10.

Figure 3:
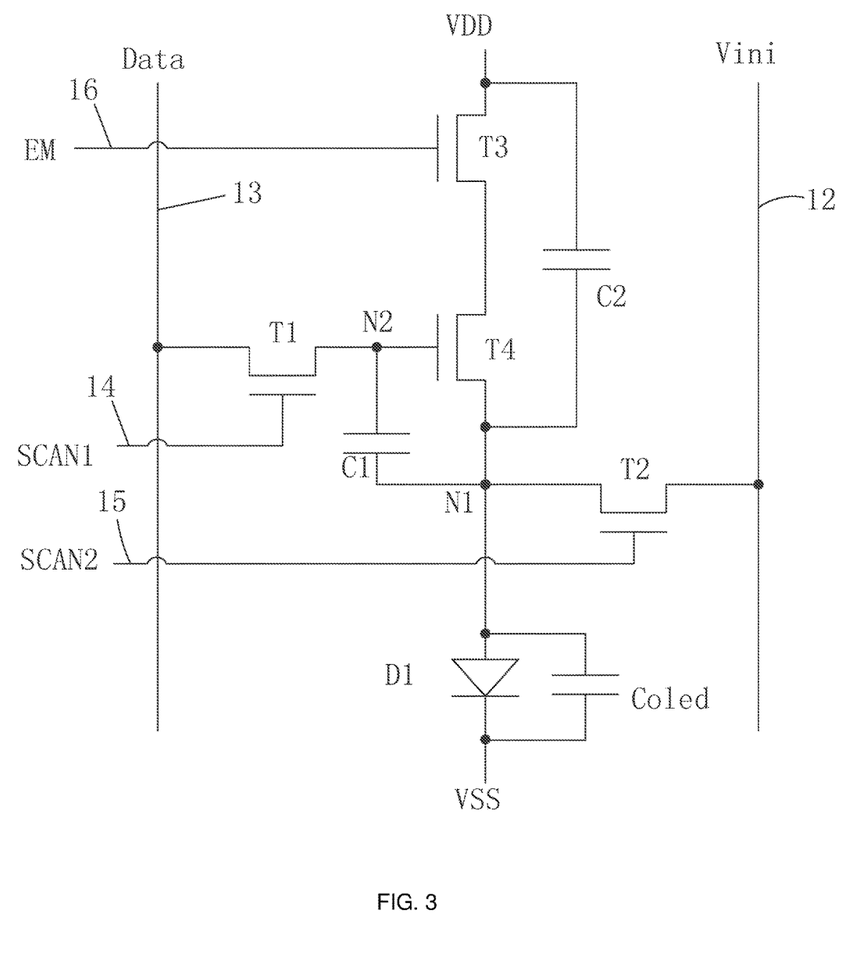
FIG. 3 is a schematic view showing the pixel driving circuit of a sub-pixel of the OLED display device provided by the embodiment of the present invention.

Specifically, as shown in FIG. 3, the active area 10 further comprises a plurality of data lines 13 arranged in parallel, spaced apart and electrically connected to the first driving circuit 2, a plurality of first scan lines 14 arranged in parallel and spaced apart, a plurality of second scan lines 15 arranged in parallel and spaced apart, and a plurality of emitting (EM) signal lines 16 arranged in parallel and spaced apart, with the data lines 13 parallel to the DC signal lines 12, the first scan line 14, the second scan line 15, and the emitting signal line 16 all perpendicular to the DC signal lines 12, and each row of sub-pixels 11 electrically connected to a first scan line 14, a second scan line 15 and an emitting signal line 16 correspondingly, and each row of sub-pixels 11 being electrically connected to a data line 13.

Specifically, as shown in FIG. 3, in a preferred embodiment of the present invention, each sub-pixel 11 is disposed with a pixel driving circuit, and the pixel driving circuit comprises: a first thin film transistor (TFT) T1, a second TFT T2, a third TFT T3, a fourth TFT T4, a first capacitor C1, a second capacitor C2, and an OLED D1; wherein the first TFT T1 having a gate electrically connected to the first scan line 14 corresponding to the sub-pixel 11, a source electrically connected to the data line 13 corresponding to the sub-pixel 11, and a drain electrically connected to a gate of the fourth TFT T4; the second TFT T2 having a gate connected to the second scan line 15 corresponding to the sub-pixel 11, a source electrically connected to a source of the fourth TFT T4, and a drain electrically connected to the DC signal line 12 corresponding to the sub-pixel 11; the third TFT T3 having a gate electrically connected to the emitting signal line 16 corresponding to the sub-pixel 11, a source electrically connected to a high voltage source VDD, and a drain electrically connected to the drain of the fourth TFT T4; the first capacitor C1 having a first end electrically connected to the gate of the fourth TFT T4, and a second end electrically connected to the source of the fourth TFT T4; the second capacitor C2 having a second end electrically connected to the source of the third TFT T3, and a drain electrically connected to the source of the fourth TFT T4; the OLED D1 having an anode electrically connected to the source of the fourth TFT T4, and a cathode electrically connected to a low voltage source VSS.

Figure 4:
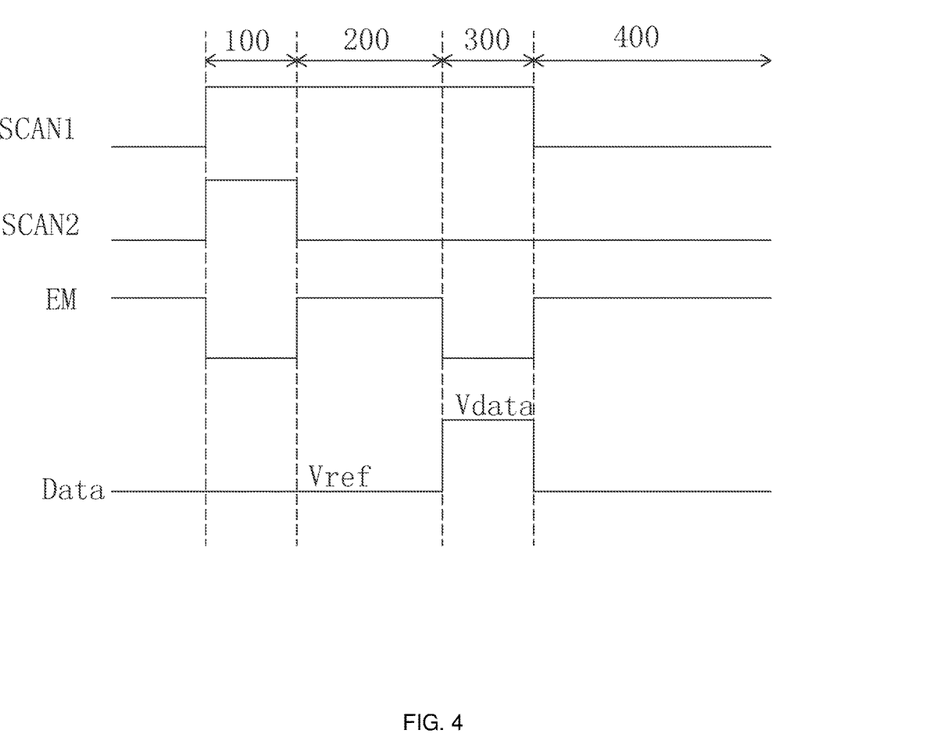
FIG. 4 is a schematic view showing the timing sequence of the OLED display device provided by the embodiment of the present invention.

It should be noted that as shown in FIGS. 3 and 4, in a preferred embodiment of the present invention, the first DC signal output end 21 and the second DC signal output end 22 are for receiving an initialization voltage Vini from the first driving circuit 2 and providing the initialization voltage Vini to the DC signal line 12; the first scan line 14, the second scan line 15, and the emitting signal line 16 are for providing a first scan signal SCAN1, a second scan signal SCAN2, and an EM signal EM to the corresponding sub-pixels 11 respectively. The data line 13 receives a data signal Data from the first driving circuit 2 and provides to the corresponding sub-pixels 11.

Furthermore, to provide the first scan signal SCAN1, the second scan signal SCAN2, and the EM signal EM to the first scan line 14, the second scan line 15, and the emitting signal line 16, the OLED display device further comprises a second driving circuit, and the first scan line 14, the second scan line 15, and the emitting signal line 16 are electrically connected to the second driving circuit to receive the first scan signal SCAN1, the second scan signal SCAN2, and the EM signal EM from the second driving circuit.

Furthermore, as shown in FIG. 3, the two ends of the OLED D1 form a parasitic capacitor Coled, which is connected in parallel with the OLED D1.

Specifically, as shown in FIG. 4, in a preferred embodiment of the present invention, the first scan signal SCAN1, the second scan signal SCAN2, the EM signal EM, and the data signal Data are combined to correspond to an initialization phase 100, a sampling phase 200, a programming phase 300, and an emitting phase 400:

In the initialization phase 100, the first scan signal SCAN1 is at a first voltage level, the second scan signal SCAN2 is at the first voltage level, the EM signal EM is at a second voltage level, and the data signal Data is at a reference voltage level Vref. The first TFT T1 and the second TFT T2 are turned on, the second node N2 becomes at the voltage level of the reference voltage Vref, the first node N1 becomes at the voltage level of the initialization voltage Vini, the fourth TFTT4 is turned on, the third TFT T3 is turned off, and the OLED D1 does not emit light.

In the sampling phase 200, the first scan signal SCAN1 is at the first voltage level, the second scan signal SCAN2 is at the second voltage level, the EM signal EM is at the first voltage level, and the data signal Data is at the reference voltage level Vref. The first TFT T1 and the third TFT T3 are turned on, the second TFT T2 is turned off, the drain of the fourth TFT T4 is at the voltage level of the high voltage source VDD, and the source is at the voltage level of the difference between the reference voltage Vref and the threshold voltage Vth of the fourth TFT T4.

In the programming phase 300, the first scan signal SCAN1 is at the first voltage level, the second scan signal SCAN2 is at the second voltage level, the EM signal EM is at the second level, and the data signal Data is at a data voltage level Vdata. The first TFT T1 and the second TFT T2 are turned on, the third TFT T3 is turned off, the data signal Vdata is written into the first node N1, the voltage level of the source of the fourth TFT T4 becomes (Vref−Vth)+C' (Vdata−Vref), wherein C'=C1/(C1+C2+Coled).

In the emitting phase 400, the first scan signal SCAN1 is at the second voltage level, the second scan signal SCAN2 is at the second voltage level, the EM signal EM is at the first voltage level, and the data signal Data is at the reference voltage level Vref. The first voltage level and the second voltage level are opposite voltage levels. The first TFT T1 and the second TFT T2 are turned off, the third TFT T3 and the fourth TFT T4 are turned on, and the OLEDD1 emits light.

Wherein the current flowing through the OLED D1 is K[Vdata−Vref−C'(Vdata−Vref)]$^2$, wherein K is the characteristic parameter of the fourth TFT T4 and is determined by the fourth TFTT4.

It should be noted that in the sampling phase 200, the magnitude of the initialization voltage Vini affects whether the compensation sampling can be completed smoothly at the end of the sampling phase 200 and whether the threshold voltage of the fourth TFT T4 can be effectively compensated in the subsequent process. Therefore, the magnitude of the initialization voltage Vini changes will affect the eventual luminance of the sub-pixels. In the preferred embodiment of the present invention, one of the two adjacent DC signal lines receives the initialization voltage from the first DC signal output end and the other one receives the initialization voltage from the second DC signal output end, so that during the initialization voltage transmission, the impedance changes on the two adjacent DC signal lines are reversed so that the initializing voltage on one DC signal line gradually decreases from the first end to the second end, and the initializing voltage on the other DC signal line gradually decreases from the end end to the first end. As such, the display unevenness of two adjacent sub-pixels can compensate each other.

Preferably, the first TFT T1, the second TFT T2, the third TFT T3, and the fourth TFT T4 are P-type TFTs, the first voltage level is a low voltage level, and the second voltage level is a high voltage level.

Preferably, the first TFT T1, the second TFT T2, the third TFT T3, and the fourth TFT T4 are N-type TFTs, the first voltage level is a high voltage level, and the second voltage level is a low voltage level.

In summary, the present invention provides an OLED display device, comprising an OLED display panel and a first driving circuit electrically connected to the OLED display panel. A DC signal line is disposed in an active area of the OLED display panel. The non-active area is disposed with a first DC signal output end and a second DC signal output end, located at two opposite ends of the OLED display panel. One of the two adjacent DC signal lines receiving a signal from the first DC signal output end, and the other from the second DC signal output end so that the impedance changes in the two adjacent DC signal lines are reversed in the signal transmission process; therefore the display unevenness of the two adjacent sub-pixels can compensate each other to reduce the impact of voltage drop of DC signal line on the display evenness of the OLED display device to improve the display quality of the OLED device.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. An organic light-emitting diode (OLED) display device, which comprises: an OLED display panel, and a first driving circuit electrically connected to the OLED display panel;

the OLED display panel comprising: an active area and a non-active area surrounding the active area;

the active area comprising: a plurality of sub-pixels arranged in an array, and a plurality of direct current (DC) signal lines arranged in parallel and arranged in a column direction extending along the sub-pixels, with each of the sub-pixels being electrically connected to a DC line; the non-active area comprising: a first DC signal output end, a second DC signal output end, a first short-circuited end, and a second short-circuited end; the first DC signal output end, the second short-circuited end and the first driving circuit being disposed and spaced apart at a first end of the OLED display panel; the second DC signal output end and the first short-circuited end being disposed and spaced apart at a second end of the OLED display panel, the first end of the OLED display panel and the second end of the OLED display panel being opposite ends of the OLED display panel along the column direction of arrangement of the sub-pixels;

the first DC signal output end and the second DC signal output end both being electrically connected to the first driving circuit; in two adjacent DC signal lines, both ends of one DC signal line being electrically connected respectively to the first DC signal output end and the first short-circuited end, and both ends of the other DC signal line being electrically connected respectively to the second DC signal output end and the second short-circuited end.

2. The OLED display device as claimed in claim 1, wherein the active area further comprises a plurality of data lines arranged in parallel, spaced apart and electrically connected to the first driving circuit, a plurality of first scan lines arranged in parallel and spaced apart, a plurality of second scan lines arranged in parallel and spaced apart, and a plurality of emitting (EM) signal lines arranged in parallel and spaced apart, with the data lines parallel to the DC signal lines, the first scan line, the second scan line, and the emitting signal line all perpendicular to the DC signal lines, and each row of sub-pixels electrically connected to a first scan line, a second scan line and an emitting signal line correspondingly, and each row of sub-pixels being electrically connected to a data line.

3. The OLED display device as claimed in claim 2, wherein each sub-pixel is disposed with a pixel driving circuit, and the pixel driving circuit comprises: a first thin film transistor (TFT), a second TFT, a third TFT, a fourth TFT, a first capacitor, a second capacitor, and an OLED;

the first TFT having a gate electrically connected to the first scan line corresponding to the sub-pixel, a source electrically connected to the data line corresponding to the sub-pixel, and a drain electrically connected to a gate of the fourth TFT;

the second TFT having a gate connected to the second scan line corresponding to the sub-pixel, a source electrically connected to a source of the fourth TFT, and a drain electrically connected to the DC signal line corresponding to the sub-pixel;

the third TFT having a gate electrically connected to the Emitting signal line corresponding to the sub-pixel, a source electrically connected to a high voltage source, and a drain electrically connected to the drain of the fourth TFT;

the first capacitor having a first end electrically connected to the gate of the fourth TFT, and a second end electrically connected to the source of the fourth TFT;

the second capacitor having a second end electrically connected to the source of the third TFT, and a drain electrically connected to the source of the fourth TFT;

the OLED having an anode electrically connected to the source of the fourth TFT, and a cathode electrically connected to a low voltage source.

4. The OLED display device as claimed in claim 3, wherein the first DC signal output end and the second DC signal output end are for receiving an initialization voltage from the first driving circuit and providing the initialization voltage to the DC signal line;

the first scan line, the second scan line, and the emitting signal line are for providing a first scan signal, a second scan signal, and an EM signal to the corresponding sub-pixels respectively.

5. The OLED display device as claimed in claim 4, wherein the first scan signal, the second scan signal, the EM signal, and the data signal are combined to correspond to an initialization phase, a sampling phase, a programming phase, and an emitting phase;

in the initialization phase, the first scan signal is at a first voltage level, the second scan signal is at the first voltage level, the EM signal is at a second voltage level, and the data signal is at a reference voltage level;

in the sampling phase, the first scan signal is at the first voltage level, the second scan signal is at the second voltage level, the EM signal is at the first voltage level, and the data signal is at the reference voltage level;

in the programming phase, the first scan signal is at the first voltage level, the second scan signal is at the second voltage level, the EM signal is at the second level, and the data signal is at a data voltage level;

in the emitting phase, the first scan signal is at the second voltage level, the second scan signal is at the second voltage level, the EM signal is at the first voltage level, and the data signal is at the reference voltage level; the first voltage level and the second voltage level are opposite voltage levels.

6. The OLED display device as claimed in claim 5, wherein the first TFT, the second TFT, the third TFT, and the fourth TFT are P-type TFTs, the first voltage level is a low voltage level, and the second voltage level is a high voltage level.

7. The OLED display device as claimed in claim 5, wherein the first TFT, the second TFT, the third TFT, and the fourth TFT are N-type TFTs, the first voltage level is a high voltage level, and the second voltage level is a low voltage level.

8. The OLED display device as claimed in claim 1, wherein the non-active area further comprises: a connection wire, and the second DC signal output end is electrically connected to the first driving circuit through the connection wire.

9. The OLED display device as claimed in claim 1, wherein the first short-circuited end is located between the second DC signal output end and the active area, the second short-circuited end is located between the first DC signal output end and the active area.

10. The OLED display device as claimed in claim 4, wherein the OLED display device further comprises a second driving circuit, and the first scan line, the second scan line, and the Emitting signal line are electrically connected to the second driving circuit to receive the first scan signal, the second scan signal, and the EM signal from the second driving circuit.

11. An organic light-emitting diode (OLED) display device, which comprises: an OLED display panel, and a first driving circuit electrically connected to the OLED display panel;

the OLED display panel comprising: an active area and a non-active area surrounding the active area;

the active area comprising: a plurality of sub-pixels arranged in an array, and a plurality of direct current (DC) signal lines arranged in parallel and arranged in a column direction extending along the sub-pixels, with each of the sub-pixels being electrically connected to a DC line; the non-active area comprising: a first DC signal output end, a second DC signal output end, a first short-circuited end, and a second short-circuited end; the first DC signal output end, the second short-circuited end and the first driving circuit being disposed and spaced apart at a first end of the OLED display panel; the second DC signal output end and the first short-circuited end being disposed and spaced apart at a second end of the OLED display panel, the first end of the OLED display panel and the second end of the OLED display panel being opposite ends of the OLED display panel along the column direction of arrangement of the sub-pixels;

the first DC signal output end and the second DC signal output end both being electrically connected to the first driving circuit; in two adjacent DC signal lines, both ends of one DC signal line being electrically connected respectively to the first DC signal output end and the first short-circuited end, and both ends of the other DC signal line being electrically connected respectively to the second DC signal output end and the second short-circuited end;

wherein the active area further comprising a plurality of data lines arranged in parallel, spaced apart and electrically connected to the first driving circuit, a plurality of first scan lines arranged in parallel and spaced apart, a plurality of second scan lines arranged in parallel and spaced apart, and a plurality of emitting (EM) signal lines arranged in parallel and spaced apart, with the data lines parallel to the DC signal lines, the first scan line, the second scan line, and the emitting signal line all perpendicular to the DC signal lines, and each row of sub-pixels electrically connected to a first scan line, a second scan line and an emitting signal line correspondingly, and each row of sub-pixels being electrically connected to a data line;

wherein each sub-pixel being disposed with a pixel driving circuit, and the pixel driving circuit comprises: a first thin film transistor (TFT), a second TFT, a third TFT, a fourth TFT, a first capacitor, a second capacitor, and an OLED;

the first TFT having a gate electrically connected to the first scan line corresponding to the sub-pixel, a source electrically connected to the data line corresponding to the sub-pixel, and a drain electrically connected to a gate of the fourth TFT;

the second TFT having a gate connected to the second scan line corresponding to the sub-pixel, a source electrically connected to a source of the fourth TFT, and a drain electrically connected to the DC signal line corresponding to the sub-pixel;

the third TFT having a gate electrically connected to the Emitting signal line corresponding to the sub-pixel, a source electrically connected to a high voltage source, and a drain electrically connected to the drain of the fourth TFT;

the first capacitor having a first end electrically connected to the gate of the fourth TFT, and a second end electrically connected to the source of the fourth TFT;

the second capacitor having a second end electrically connected to the source of the third TFT, and a drain electrically connected to the source of the fourth TFT;

the OLED having an anode electrically connected to the source of the fourth TFT, and a cathode electrically connected to a low voltage source;

wherein the non-active area further comprising: a connection wire, and the second DC signal output end being electrically connected to the first driving circuit through the connection wire;

wherein the first short-circuited end being located between the second DC signal output end and the active area, the second short-circuited end being located between the first DC signal output end and the active area.

12. The OLED display device as claimed in claim 11, wherein the first DC signal output end and the second DC signal output end are for receiving an initialization voltage from the first driving circuit and providing the initialization voltage to the DC signal line;

wherein the first scan line, the second scan line, and the emitting signal line are for providing a first scan signal, a second scan signal, and an EM signal to the corresponding sub-pixels respectively.

13. The OLED display device as claimed in claim 12, wherein the first scan signal, the second scan signal, the EM signal, and the data signal are combined to correspond to an initialization phase, a sampling phase, a programming phase, and an emitting phase;

in the initialization phase, the first scan signal is at a first voltage level, the second scan signal is at the first voltage level, the EM signal is at a second voltage level, and the data signal is at a reference voltage level;

in the sampling phase, the first scan signal is at the first voltage level, the second scan signal is at the second voltage level, the EM signal is at the first voltage level, and the data signal is at the reference voltage level;

in the programming phase, the first scan signal is at the first voltage level, the second scan signal is at the second voltage level, the EM signal is at the second level, and the data signal is at a data voltage level;

in the emitting phase, the first scan signal is at the second voltage level, the second scan signal is at the second voltage level, the EM signal is at the first voltage level, and the data signal is at the reference voltage level; the first voltage level and the second voltage level are opposite voltage levels.

14. The OLED display device as claimed in claim 13, wherein the first TFT, the second TFT, the third TFT, and the fourth TFT are P-type TFTs, the first voltage level is a low voltage level, and the second voltage level is a high voltage level.

15. The OLED display device as claimed in claim 13, wherein the first TFT, the second TFT, the third TFT, and the fourth TFT are N-type TFTs, the first voltage level is a high voltage level, and the second voltage level is a low voltage level.

16. The OLED display device as claimed in claim 12, wherein the OLED display device further comprises a second driving circuit, and the first scan line, the second scan line, and the Emitting signal line are electrically connected to the second driving circuit to receive the first scan signal, the second scan signal, and the EM signal from the second driving circuit.

* * * * *